(12) United States Patent
Lee et al.

(10) Patent No.: US 12,347,763 B2
(45) Date of Patent: Jul. 1, 2025

(54) PACKAGING OF THREE-DIMENSIONAL INTEGRATED CIRCUIT BY ENCAPSULATION WITH COPPER POSTS AND DOUBLE SIDED REDISTRIBUTION LAYER

(71) Applicant: ROCKLEY PHOTONICS LIMITED, Altrincham (GB)

(72) Inventors: Seungjae Lee, Pasadena, CA (US); Brett Sawyer, Pasadena, CA (US); David Arlo Nelson, Fort Collins, CO (US)

(73) Assignee: Rockley Photonics Limited, Altrincham (GB)

( * ) Notice: Subject to any disclaimer, the term of this patent is extended or adjusted under 35 U.S.C. 154(b) by 426 days.

(21) Appl. No.: 17/757,823

(22) PCT Filed: Dec. 14, 2020

(86) PCT No.: PCT/EP2020/086022
§ 371 (c)(1),
(2) Date: Jun. 21, 2022

(87) PCT Pub. No.: WO2021/130045
PCT Pub. Date: Jul. 1, 2021

(65) Prior Publication Data
US 2023/0343686 A1    Oct. 26, 2023

(30) Foreign Application Priority Data
Dec. 24, 2019 (GB) .................................. 1919273

(51) Int. Cl.
*H01L 23/498* (2006.01)
*G01F 1/00* (2022.01)
(Continued)

(52) U.S. Cl.
CPC .... *H01L 23/49827* (2013.01); *H01L 21/4853* (2013.01); *H01L 21/565* (2013.01);
(Continued)

(58) Field of Classification Search
CPC ............ H01L 23/49827; H01L 23/481; H01L 21/76898; H01L 21/486; H01L 2225/06548
See application file for complete search history.

(56) References Cited

U.S. PATENT DOCUMENTS 8,298,944 B1    10/2012  West
2011/0204505 A1*  8/2011  Pagaila ................. H01L 21/568
                                                                    438/109

(Continued)

FOREIGN PATENT DOCUMENTS

WO    WO 2018/125170 A1    7/2018

OTHER PUBLICATIONS

International Search Report and Written Opinion of the International Searching Authority, Mailed Mar. 16, 2021, Corresponding to PCT/EP2020/086022, 9 pages.
(Continued)

*Primary Examiner* — Peniel M Gumedzoe
*Assistant Examiner* — Douglas Yap
(74) *Attorney, Agent, or Firm* — Womble Bond Dickinson (US) LLP

(57) ABSTRACT

A semiconductor package. In some embodiments, the package has a top surface and a bottom surface, and includes: a semiconductor die having a front surface, a back surface, and a plurality of edges; a mold compound, on the back surface of the die and the edges of the die; a plurality of first conductive elements extending through the mold compound on the back surface of the die to the top surface of the
(Continued)

package; and a plurality of second conductive elements on the bottom surface of the package.

15 Claims, 7 Drawing Sheets

(51) Int. Cl.
    *G02B 1/00* (2006.01)
    *H01L 21/48* (2006.01)
    *H01L 21/56* (2006.01)
    *H01L 23/29* (2006.01)
    *H01L 23/31* (2006.01)
    *H01L 23/538* (2006.01)
    *H10D 84/00* (2025.01)
    *H10D 84/03* (2025.01)
    *H10D 88/00* (2025.01)

(52) U.S. Cl.
    CPC ........ *H01L 23/293* (2013.01); *H01L 23/3107* (2013.01); *H01L 23/49838* (2013.01); *H01L 23/49866* (2013.01); *H01L 23/538* (2013.01); *H10D 84/00* (2025.01); *H10D 84/038* (2025.01); *H10D 88/01* (2025.01); *G01F 1/00* (2013.01); *G02B 1/00* (2013.01)

(56) References Cited

U.S. PATENT DOCUMENTS

| | | | |
|---|---|---|---|
| 2011/0291283 A1* | 12/2011 | Chi | H01L 24/19 257/773 |
| 2014/0038353 A1 | 2/2014 | Kim et al. | |
| 2014/0162449 A1 | 6/2014 | An et al. | |
| 2014/0239508 A1* | 8/2014 | Ichikawa | H01L 24/06 257/774 |
| 2016/0141260 A1 | 5/2016 | Chang et al. | |
| 2019/0131273 A1* | 5/2019 | Chen | H01L 24/19 |
| 2020/0006088 A1* | 1/2020 | Yu | G02B 6/30 |
| 2020/0161242 A1* | 5/2020 | Lin | H03K 19/0013 |
| 2020/0294964 A1* | 9/2020 | Min | H01L 23/295 |

OTHER PUBLICATIONS

U.K. Intellectual Property Office Search and Examination Report, dated Jun. 18, 2020, for Patent Application No. GB1919273.1, 5 pages.
U.K. Intellectual Property Office Search and Examination Report, dated Aug. 18, 2022, for Patent Application No. GB1919273.1, 4 pages.
Chinese Notification of the First Office Action, for Patent Application No. 202080089603.7, mailed Nov. 22, 2024, 6 pages.
Partial English translation of the Chinese Notification of the First Office Action, for Patent Application No. 202080089603.7, mailed Nov. 22, 2024, 10 pages.

* cited by examiner

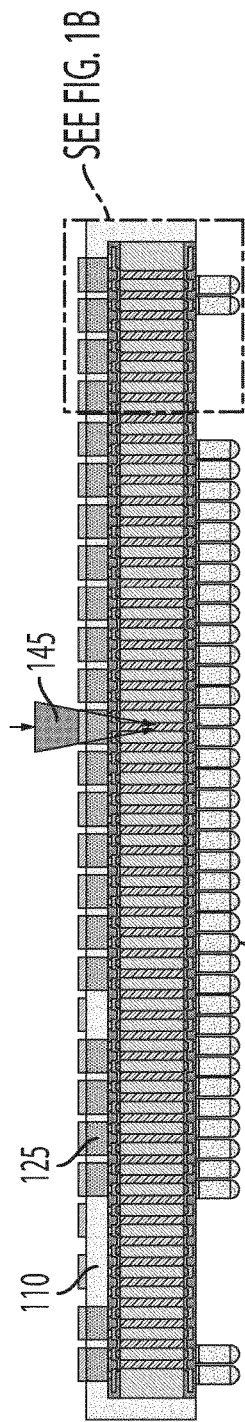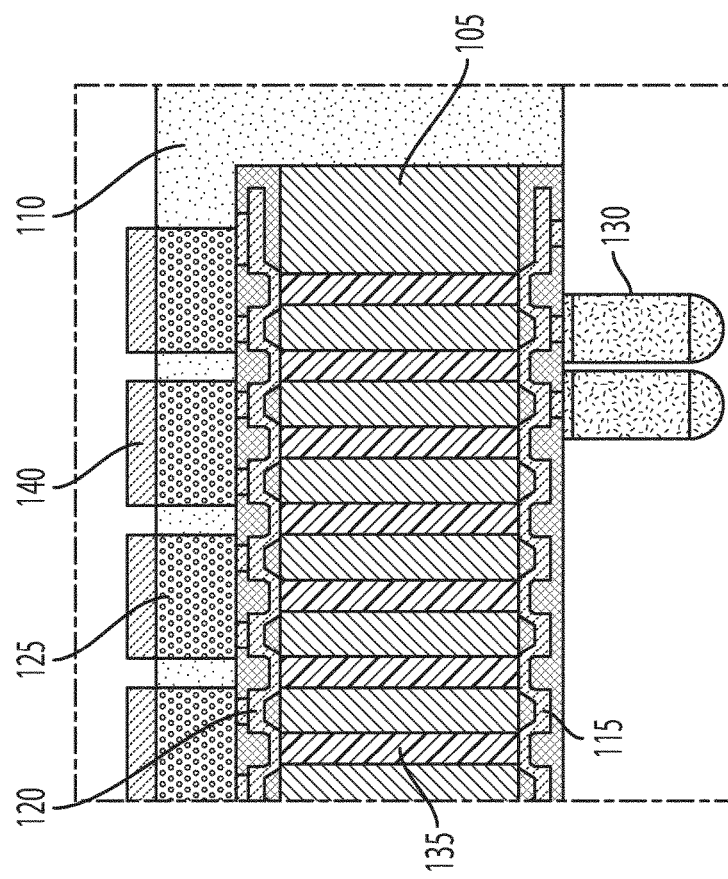

PACKAGING OF THREE-DIMENSIONAL INTEGRATED CIRCUIT BY ENCAPSULATION WITH COPPER POSTS AND DOUBLE SIDED REDISTRIBUTION LAYER

CROSS-REFERENCE TO RELATED APPLICATION(S)

This application is a U.S. national stage entry, under 35 U.S.C. § 371, of International Application Number PCT/EP2020/086022, filed on Dec. 14, 2020, which claims priority to British Patent Application Number 1919273.1, filed Dec. 24, 2019. The entire contents of all of the applications identified in this paragraph are incorporated herein by reference.

FIELD

One or more aspects of embodiments according to the present disclosure relate to packaging, and more particularly to an integrated circuit package including copper posts and epoxy mold compound.

BACKGROUND

A semiconductor die with vias extending through it, such as a silicon die with through-silicon vias, may be thin, as a result of the process of forming the through-vias. In some embodiments such a die is about 200 microns thick, and, as a result, it may be relatively fragile, e.g., vulnerable to cracking or chipping.

Thus, there is a need for a package that protects a thin semiconductor die while making possible the forming of electrical connections to one or both surfaces of the die.

SUMMARY

According to an embodiment of the present invention, there is provided a package having a top surface and a bottom surface, and including: a semiconductor die having a front surface, a back surface, and a plurality of edges; a mold compound, on the back surface of the die; a plurality of first conductive elements extending through the mold compound on the back surface of the die to the top surface of the package; and a plurality of second conductive elements on the bottom surface of the package.

In some embodiments, the mold compound is further on the edges of the die.

In some embodiments, the semiconductor die is a silicon die, and the mold compound is an epoxy mold compound.

In some embodiments, the semiconductor die includes a plurality of vias extending from the front surface of the die to the back surface of the die.

In some embodiments, the semiconductor die includes a plurality of transistors, on the front surface of the die.

In some embodiments, the package further includes a first redistribution layer, on the front surface of the die.

In some embodiments, the first redistribution layer does not extend past a first edge of the plurality of edges of the die.

In some embodiments, the package further includes a second redistribution layer, on the back surface of the die.

In some embodiments: each of the first conductive elements is a copper post having a diameter of at least 100 microns and a height of at least 50 microns, the separation between adjacent first conductive elements is at least 300 microns, each of the second conductive elements is a copper pillar bump having a diameter of at most 50 microns and a height of at most 50 microns, and the separation between adjacent second conductive elements is at most 120 microns.

In some embodiments, the package further includes: a first redistribution layer, on the front surface of the die; and a second redistribution layer, on the back surface of the die, wherein each of the second conductive elements is connected, through the first redistribution layer and through the vias, to the front surface of the die.

In some embodiments: the semiconductor die includes a transimpedance amplifier, on the front surface of the semiconductor die; and the transimpedance amplifier has: an input connected through the first redistribution layer to a conductive element of the plurality of second conductive elements; and an output connected through the first redistribution layer, through a via of the plurality of vias, and through the second distribution layer, to a conductive element of the plurality of first conductive elements.

In some embodiments: the semiconductor die includes a modulator driver, on the front surface of the semiconductor die, the modulator driver has: an input connected through the first redistribution layer, through a via of the plurality of vias, and through the second distribution layer, to a conductive element of the plurality of first conductive elements; and an input connected through the first redistribution layer to a conductive element of the plurality of second conductive elements.

In some embodiments, the method further includes: forming a plurality of conductive posts on a surface of a semiconductor wafer having a front surface and a back surface, the conductive posts being formed on the back surface of the semiconductor wafer; dicing the semiconductor wafer to form a plurality of semiconductor dies, each of the semiconductor dies having a front surface corresponding to the front surface of the semiconductor wafer, a back surface corresponding to the back surface of the semiconductor wafer, and a plurality of edges; applying a mold compound to the semiconductor dies, the applying including covering the back surface of each of the semiconductor dies with the mold compound; grinding the mold compound to reveal the conductive posts; and forming a plurality of conductive pillar bumps on the front surface of each of the semiconductor dies.

In some embodiments, the applying of the mold compound further includes covering the edges of each of the semiconductor dies with the mold compound.

In some embodiments, the conductive posts are copper posts and the conductive pillar bumps are copper pillar bumps.

In some embodiments, each of the semiconductor dies is a silicon die having a plurality of through-silicon vias each extending from the front surface of the semiconductor die to the back surface of the semiconductor die.

In some embodiments, the method further includes forming a first redistribution layer on the front surface of the semiconductor wafer before the forming of the plurality of conductive pillar bumps, wherein the forming of the plurality of conductive pillar bumps includes forming the plurality of conductive pillar bumps directly on the first redistribution layer.

In some embodiments, the method further includes forming a second redistribution layer on the back surface of the semiconductor wafer before the forming of the conductive posts, wherein the forming of the conductive posts includes forming the conductive posts directly on the second redistribution layer.

BRIEF DESCRIPTION OF THE DRAWINGS

These and other features and advantages of the present disclosure will be appreciated and understood with reference to the specification, claims, and appended drawings wherein:

FIG. 1A is a cross sectional view of an integrated circuit package, according to an embodiment of the present disclosure;

FIG. 1B is an enlarged view of a portion of FIG. 1A;

DETAILED DESCRIPTION

Figure 2A:
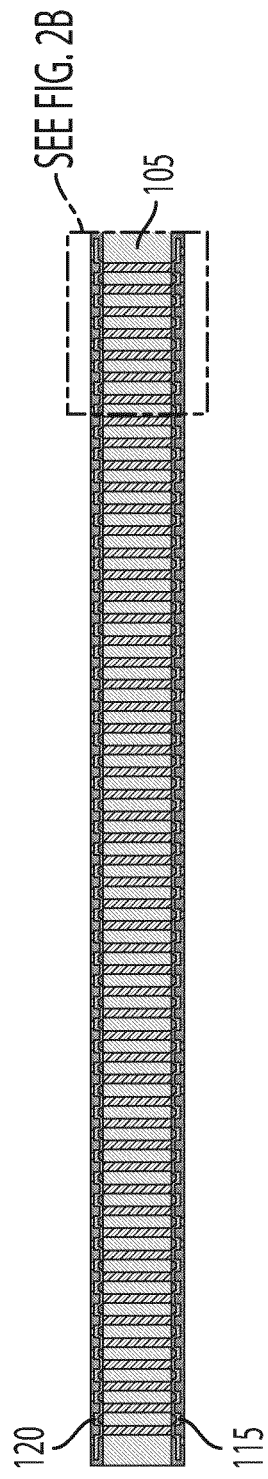
FIG. 2A is a cross sectional view of an intermediate product in a process for fabricating an integrated circuit package, according to an embodiment of the present disclosure.

The detailed description set forth below in connection with the appended drawings is intended as a description of exemplary embodiments of an integrated circuit package provided in accordance with the present disclosure and is not intended to represent the only forms in which the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the scope of the disclosure. As denoted elsewhere herein, like element numbers are intended to indicate like elements or features.

Referring to FIGS. 1A and 1B (FIG. 1B being an enlarged view of a portion of FIG. 1A), in some embodiments an integrated circuit package includes a silicon die 105 encapsulated on several sides by a mold compound (e.g., an epoxy mold compound (EMC)) 110. In the orientation of FIGS. 1A and 1B, the front surface of the silicon die 105 (on which active components, e.g., transistors, may be fabricated, at a foundry) is the bottom surface of the silicon die 105, and the top surface is the back surface. A first redistribution layer 115 (or "front side RDL") is secured to the front surface of the silicon die 105 and a second redistribution layer 120 (or "back side RDL") is secured to the back surface of the silicon die 105.

A plurality of first conductive elements, e.g., copper posts 125, form external connections to the second redistribution layer 120, through the layer of epoxy mold compound 110 on the back surface of the silicon die 105. The copper posts may be positioned with a center-to-center separation of at least 300 microns (e.g., they may be positioned on a grid with a pitch of at least 300 microns), and each copper post may have a diameter of about 200 microns, e.g., a diameter between 100 microns and 1000 microns, and a height of at least 50 microns (e.g., a height of about 100 microns). A passivation layer (e.g., a polyimide passivation layer) may be present on the second redistribution layer 120; vias (e.g., 10-micron diameter vias) through the passivation layer may be used to form connections, through the passivation layer, between the second redistribution layer 120 and the copper posts 125. A plurality of second conductive elements, e.g., copper pillar bumps 130, form external connections to the first redistribution layer 115. The copper pillar bumps may be positioned with a center-to-center separation of 120 microns or less (e.g., they may be positioned on a grid with a pitch of at most 120 microns), and each copper pillar bump may have a diameter of at most 50 microns, and a height of at most 50 microns. The silicon die 105 may include a plurality of through-silicon vias (TSVs) 135 forming conductive paths between (i) the front surface of the silicon die 105 and the first redistribution layer 115 and (ii) the back surface of the silicon die 105 and the second redistribution layer 120.

In some embodiments, no external connections are made outside the perimeter of the silicon die 105, and each edge of each of the first redistribution layer 115 and the second redistribution layer 120 may be flush with a corresponding edge of the silicon die 105 (as shown in FIG. 1B), or the silicon die 105 may extend out slightly beyond the edge of one or both of the first redistribution layer 115 and the second redistribution layer 120, or one or the other, or both, of the first redistribution layer 115 and the second redistribution layer 120 may extend out slightly (e.g., less than 500 microns, or less than 100 microns) beyond the edge of the silicon die 105.

A third redistribution layer (not shown in FIGS. 1A and 1B) may be formed on the top surface of the integrated circuit package, i.e., on the layer of epoxy mold compound 110 on the back surface of the silicon die 105. A surface finish 140 may be formed on the third redistribution layer (if it is present) and on the outer ends of the copper posts 125 (i.e., on the upper ends, in the orientation of FIGS. 1A and 1B). This surface finish may be, for example, (i) nickel/gold, (ii) electroless nickel immersion gold (ENIG), or (iii) electroless nickel, electroless palladium, and immersion gold (ENEPIG). The surface finish may provide conductive pads suitable for use as a land grid array, e.g., for making connections to another integrated circuit (as discussed in further detail below).

The presence (i) of the layer of epoxy mold compound 110 on the back surface of the silicon die 105 and (ii) of the copper posts 125 may reduce the risk that connections made to the back surface of the silicon die 105 will damage the silicon die 105. For example, in some embodiments, another integrated circuit (e.g., a CMOS packet-switching ASIC), which may have, on its lower surface, an array of conductors (e.g., a land grid array) may, in operation, be installed on the top surface of the integrated circuit package, and a plurality of electrical connections may be made between the array of conductors of the CMOS packet-switching ASIC and the copper posts 125 of the integrated circuit package, e.g., with a socket including an array of compressible conductive elements 145 (one of which is shown, for purposes of illustration, in FIG. 1A). The compressive force (and any shear forces) applied to the silicon die 105 by each of the compressible conductive elements 145 may be distributed over a larger area of the silicon die 105 in the presence of (i) the layer of epoxy mold compound 110 on the back surface of the silicon die 105 and of (ii) the copper posts 125, than the area over which such forces would be distributed if these elements were absent.

The epoxy mold compound 110 may cover the edges (i.e., the side surfaces) of the silicon die 105, in addition to covering the back surface of the silicon die 105. The presence of the epoxy mold compound 110 on the edges of the silicon die 105 may protect the silicon die 105 from chipping. In some embodiments, the layer of epoxy mold compound 110 on each edge is between 50 microns and 100 microns thick.

Figure 2B:
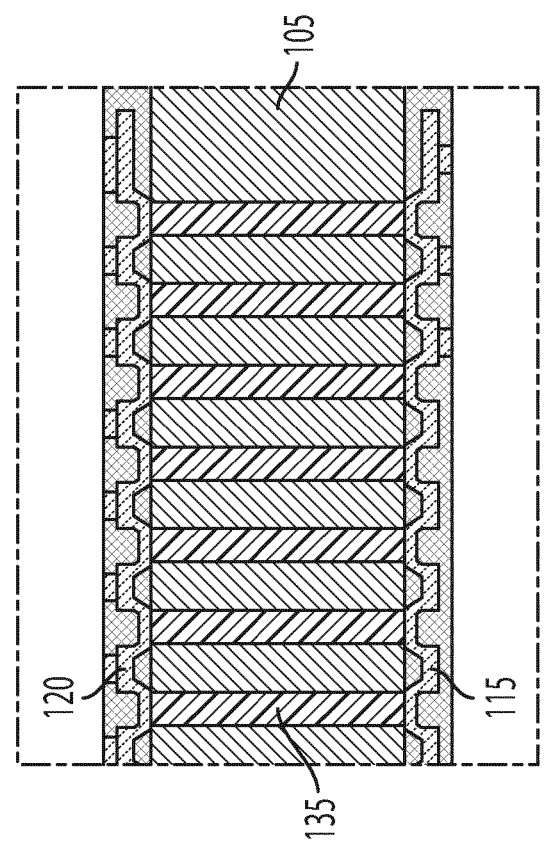
FIG. 2B is an enlarged view of a portion of FIG. 2A.

FIGS. 2A and 2B (FIG. 2B being an enlarged view of a portion of FIG. 2A) show an intermediate product that may be fabricated as part of a process for fabricating the integrated circuit package of FIGS. 1A and 1B. The intermediate product of FIGS. 2A and 2B may be fabricated by first fabricating a preliminary silicon die at a foundry. The preliminary silicon die may be fabricated from a silicon wafer, and it may include structures (e.g., transistors) on its front surface, and vias (e.g., blind vias for forming through-silicon vias) extending from the front surface to some depth (e.g., about 200 microns) into the wafer. A first redistribution layer 115 may be formed on the front side of the wafer. The wafer may be bonded onto a first carrier, and the back of the wafer may be ground to reveal the ends of the through-silicon vias, so that, after it is ground, the through-silicon vias 135 extend all the way through the wafer. A second redistribution layer 120 may then be formed on the back side of the wafer. In some embodiments the through-silicon vias are instead formed after the wafer is thinned by grinding.

Figure 3A:
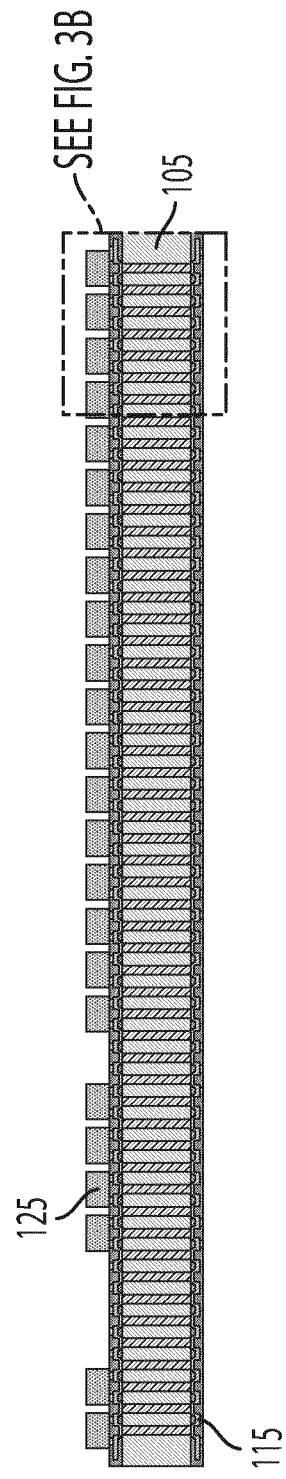
FIG. 3A is a cross sectional view of an intermediate product in a process for fabricating an integrated circuit package, according to an embodiment of the present disclosure.
Figure 3B:
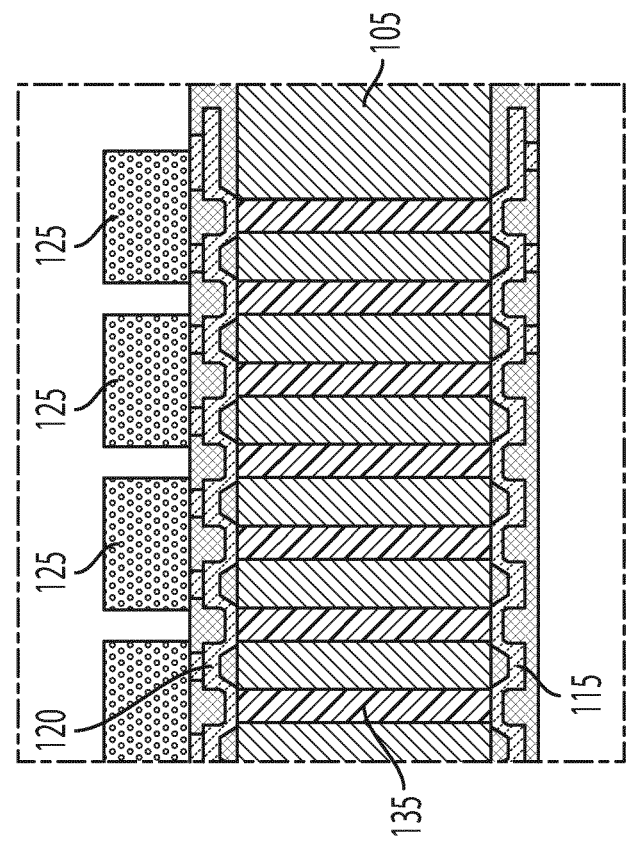
FIG. 3B is an enlarged view of a portion of FIG. 3A.

FIGS. 3A and 3B (FIG. 3B being an enlarged view of a portion of FIG. 3A) show an intermediate product that may be formed from the intermediate product of FIGS. 2A and 2B. Copper posts 125 may be formed (e.g., by plating) on the back side of the wafer (e.g., on the second redistribution layer 120, and the wafer may be debonded from the first carrier. At this point in the process, the wafer may be in a form suitable for packing and shipping to another facility, if the remaining fabricating steps are to be performed at another facility.

Figure 4A:
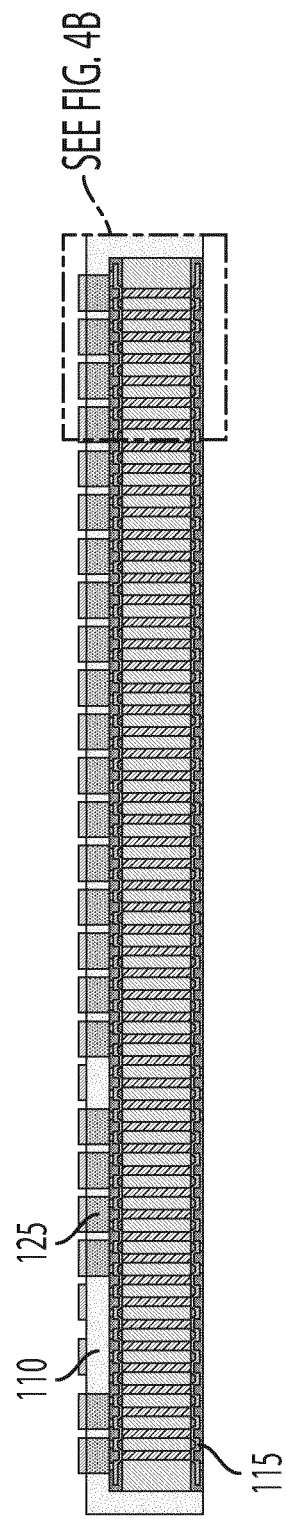
FIG. 4A is a cross sectional view of an intermediate product in a process for fabricating an integrated circuit package, according to an embodiment of the present disclosure.
Figure 4B:
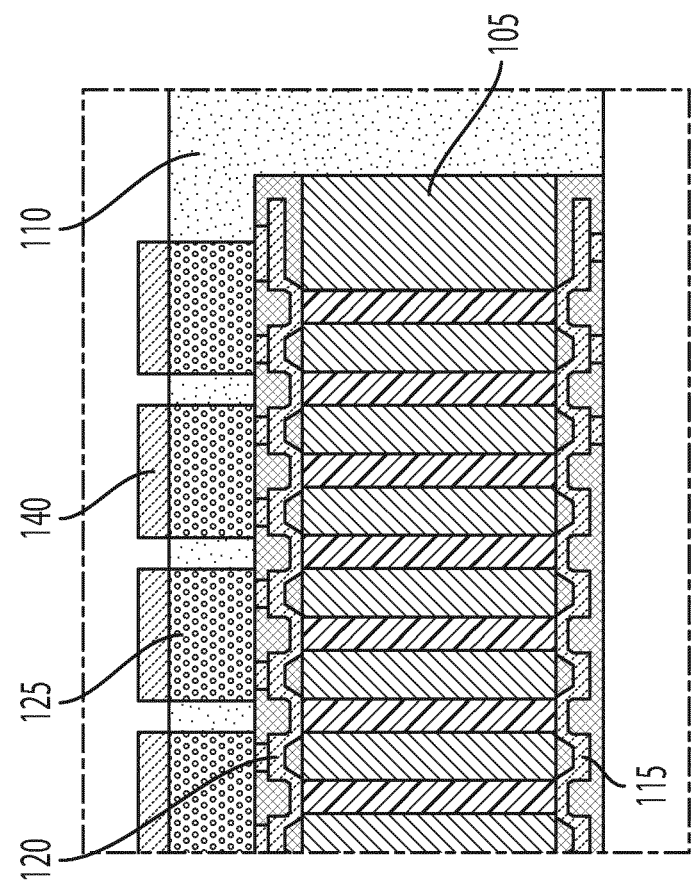
FIG. 4B is an enlarged view of a portion of FIG. 4A.

FIGS. 4A and 4B (FIG. 4B being an enlarged view of a portion of FIG. 4A) show an intermediate product that may be formed from the intermediate product of FIGS. 3A and 3B. The wafer may be diced and the resulting dies repopulated onto a second carrier, and over-molded with epoxy mold compound 110. The back of the over-molded intermediate product may then be ground to reveal (i.e., expose) the ends of the copper posts 125, and a third redistribution layer (not shown), if one is to be made part of the integrated circuit package, may be formed on the top surface of the layer of epoxy mold compound 110 on the back surface of the silicon die 105. A surface finish 140 may then be formed on the third redistribution layer (if it is present) and on the outer ends of the copper posts 125. The view of FIGS. 4A and 4B is drawn for convenience to show only one package, although at the fabrication step corresponding to FIGS. 4A and 4B a plurality of dies may remain bonded together by the epoxy mold compound 110.

Figure 5A:
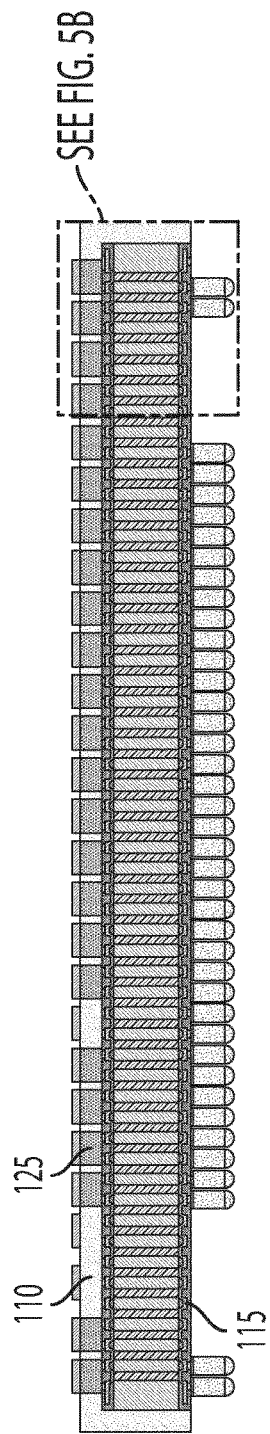
FIG. 5A is a cross sectional view of an integrated circuit package, according to an embodiment of the present disclosure.
Figure 5B:
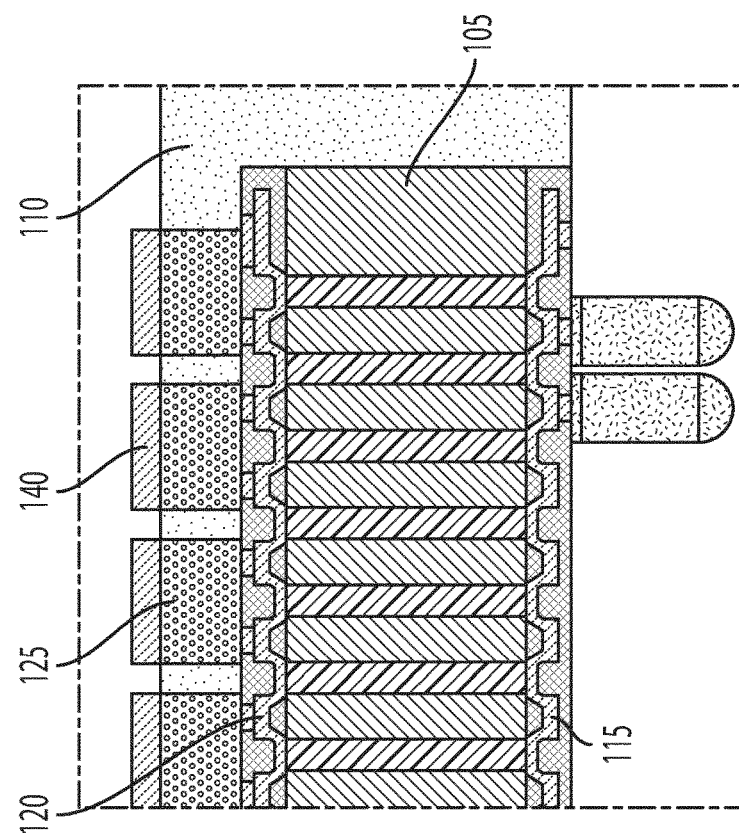
FIG. 5B is an enlarged view of a portion of FIG. 5A.

FIGS. 5A and 5B (FIG. 5B being an enlarged view of a portion of FIG. 5A) show an integrated circuit package that may be formed from the intermediate product of FIGS. 4A and 4B. The intermediate product of FIGS. 4A and 4B may be debonded from the second carrier, and the back side of the intermediate product may be bonded to a third carrier. An additional (e.g., fourth) redistribution layer may be formed on the front side of the silicon die at this step (or, if the first redistribution layer 115 was not formed in a previous fabrication step, it may be formed at this step), and copper pillar bumps 130 may be formed on the front side redistribution layer (e.g., on the first redistribution layer 115, or on the fourth redistribution layer, if both the first redistribution layer 115 and the fourth redistribution layer are present). The copper pillar bumps 130 may be formed for example, in two or three steps, including a step in which copper is deposited (e.g., plated), an optional step in which nickel is deposited on the copper, and a step in which a tin silver alloy is deposited on (i) the nickel, if present, or on (ii) the copper if the nickel is absent. The intermediate product may then be debonded from the third carrier, diced (e.g., cut apart at the strips of epoxy mold compound 110 between adjacent dies), packed and shipped.

Figure 6A:
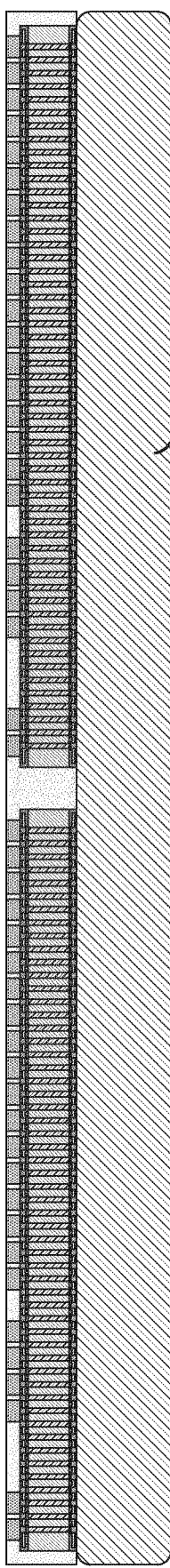
FIG. 6A is a cross sectional view of an intermediate product, on a carrier, in a process for fabricating an integrated circuit package, according to an embodiment of the present disclosure.
Figure 6B:
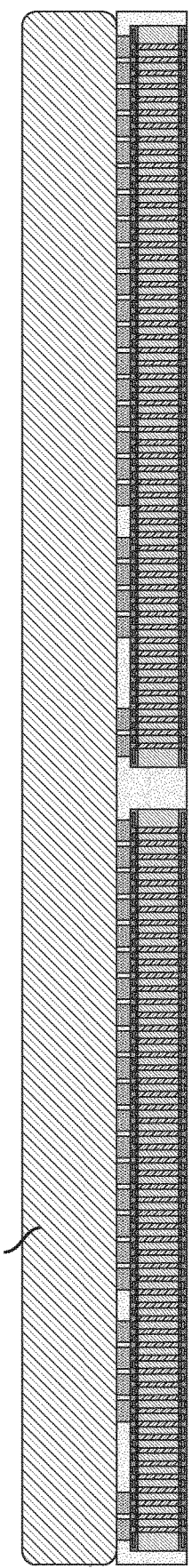
FIG. 6B is a cross sectional view of an intermediate product, on a carrier, in a process for fabricating an integrated circuit package, according to an embodiment of the present disclosure.
Figure 6C:
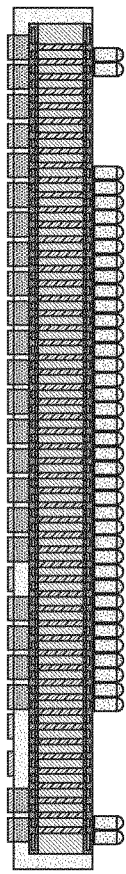
FIG. 6C is a cross sectional view of an integrated circuit package, according to an embodiment of the present disclosure.

FIG. 6A shows the intermediate product of FIGS. 4A and 4B, on the second carrier 610, FIG. 6B shows this intermediate product after debonding from the second carrier 610 and bonding to the third carrier 620, and FIG. 6C shows the final product, in some embodiments. For ease of illustration, FIGS. 6A and 6B shows only two dies encapsulated in the epoxy mold compound 110; in some embodiments, however, a larger number of dies are present in this intermediate product.

Figure 7:
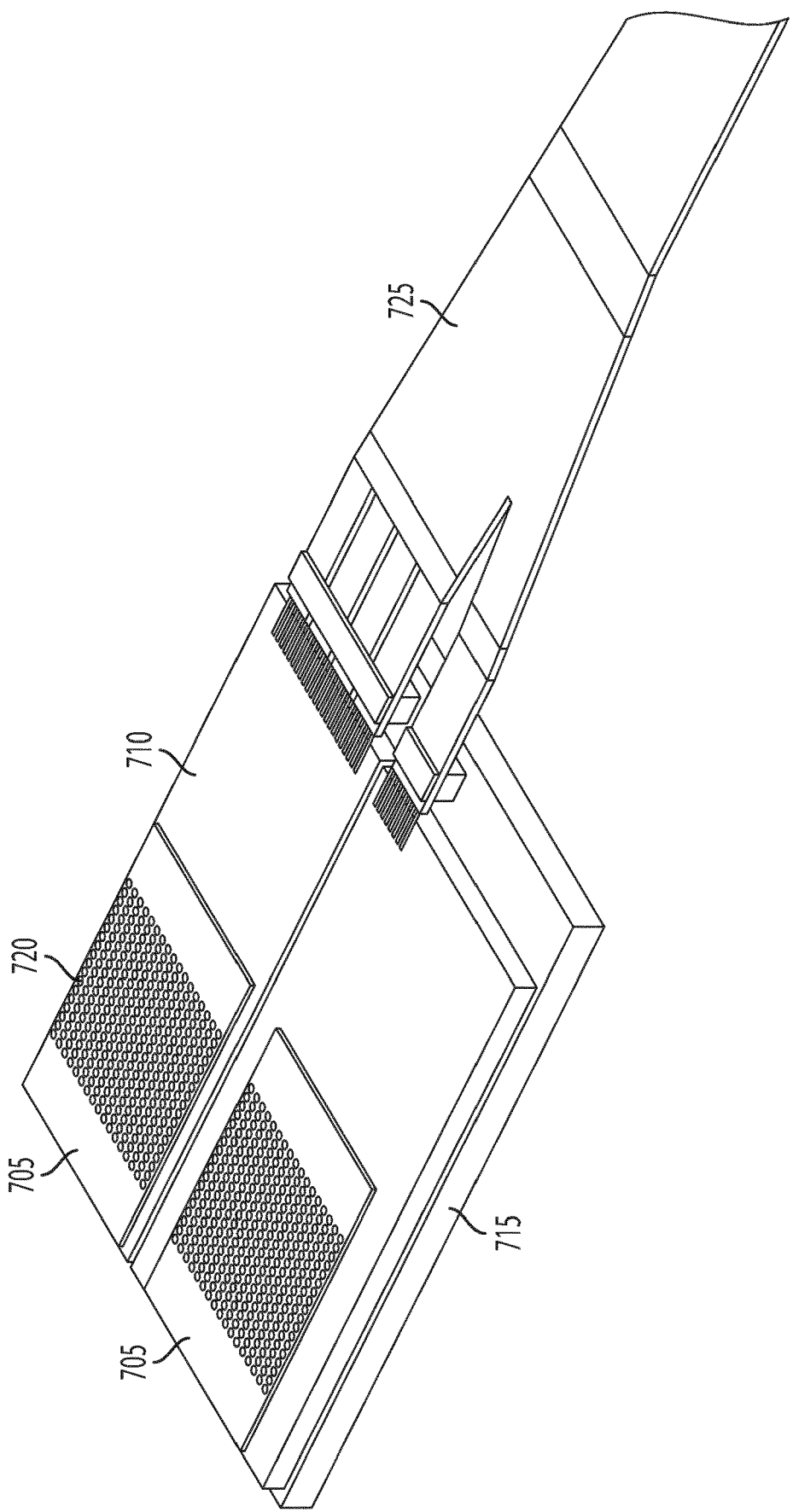
FIG. 7 is a perspective view of a system employing the integrated circuit package of FIGS. 1A and 1B, according to an embodiment of the present disclosure.

FIG. 7 shows a system employing the integrated circuit package 705, in some embodiments. The integrated circuit package 705 is installed on a photonic integrated circuit (PIC) 710, which is in turn installed on an optical engine carrier 715. The upper surface of each of the copper posts 125 forms a conductive surface 720 of a land grid array (formed, e.g., by the surface finish 140) for forming contact with one or more other components (e.g., a CMOS packet-switching ASIC (not shown), as discussed above). The PIC 710 may include V-grooves and mode converters for aligning optical fibers 725 to the PIC 710 and for performing mode conversions between the optical eigenmodes of the optical fibers and the eigenmodes of optical waveguides (e.g., 3 micron rib or strip waveguides) on the PIC 710. The PIC may further include optoelectronic devices such as photodetectors and optical modulators for converting optical signals (e.g., amplitude-modulated light) to electrical signals, and vice versa, connected to the optical waveguides. The electrical terminals of the optoelectronic devices may be connected, by conductive traces on the PIC, to the copper pillar bumps 130 of the integrated circuit package 705. The structures on the front surface of the silicon die 105 of each integrated circuit package 705 may include transistor circuits, e.g., interface circuits (e.g., circuits (such as transimpedance amplifiers) for amplifying signals from photodetectors, and modulator drivers for driving modulators) for interfacing the optoelectronic devices to, e.g., a CMOS packet-switching ASIC. In such an embodiment, the optoelectronic devices may be connected to the interface circuits through the copper pillar bumps 130 and through the first redistribution layer 115, and the interface circuits may be connected to the CMOS packet-switching ASIC through the first redistribution layer 115, through the through-silicon vias 125, through the second redistribution layer 120, and through the copper posts 125.

As used herein, a "copper post" is a post containing at least 50% copper by weight. As used herein, a "copper pillar bump" is a pillar bump containing at least 50% copper by weight. As used herein, the word "or" is inclusive, so that, for example, "A or B" means any one of (i) A, (ii) B, and (iii) A and B.

It will be understood that when an element or layer is referred to as being "on", "formed on", "connected to", "coupled to", or "adjacent to" another element or layer, it may be directly on, formed directly on, directly connected to, directly coupled to, or immediately adjacent to the other element or layer, or one or more intervening elements or layers may be present. In contrast, when an element or layer is referred to as being "directly on", "formed directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" or "between 1.0 and 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although exemplary embodiments of an integrated circuit package have been specifically described and illustrated herein, many modifications and variations will be apparent to those skilled in the art. Accordingly, it is to be understood that an integrated circuit package constructed according to principles of this disclosure may be embodied other than as specifically described herein. The invention is also defined in the following claims, and equivalents thereof.

What is claimed is:

1. A system comprising:
    a photonic integrated circuit (PIC); and
    a package installed on the PIC and having a top surface and a bottom surface, and comprising:
        a semiconductor die having a front surface, a back surface, and a plurality of side surfaces between the front surface and the back surface, the die comprising a plurality of vias extending from the front surface of the die to the back surface of the die;
        a mold compound, on the back surface of the die;
        a plurality of first conductive elements extending entirely through a portion of the mold compound on the back surface of the die to the top surface of the package;
        a plurality of second conductive elements on the bottom surface of the package and entirely separated from the mold compound;
        a first redistribution layer having a back surface, directly on the front surface of the die and directly connected to the plurality of vias, and a front surface opposite to the bottom surface, the first redistribution layer not extending beyond the side surfaces of the die, and the plurality of second conductive elements being directly on the front surface of the first redistribution layer and connected to the plurality of vias through the first redistribution layer; and
        a second redistribution layer, directly on the back surface of the die and directly connected to the plurality of vias, the second redistribution layer not extending beyond the side surfaces of the die, and the plurality of first conductive elements being directly on the second redistribution layer and connected to the plurality of vias through the second redistribution layer,
    wherein the mold compound is on the side surfaces of the die, and no portion of the mold compound is below the front surface of the die along a thickness direction of the die,
    wherein only the plurality of second conductive elements directly contact the front surface of the first redistribution layer, and
    wherein the second conductive elements are directly connected to the PIC.

2. The package of claim 1, wherein the semiconductor die is a silicon die, and the mold compound is an epoxy mold compound.

3. The package of claim 1, wherein the semiconductor die comprises a plurality of transistors, on the front surface of the die.

4. The package of claim 1, wherein:
    each of the first conductive elements is a copper post having a diameter of at least 100 microns and a height of at least 50 microns,
    the separation between adjacent first conductive elements is at least 300 microns, each of the second conductive elements is a copper pillar bump having a diameter of at most 50 microns and a height of at most 50 microns, and
    the separation between adjacent second conductive elements is at most 120 microns.

5. The package of claim 1,
    wherein each of the second conductive elements is connected, through the first redistribution layer and through the vias, to the front surface of the die.

6. The package of claim 5, wherein:
    the semiconductor die comprises a transimpedance amplifier, on the front surface of the semiconductor die; and
    the transimpedance amplifier has:
        an input connected through the first redistribution layer to a conductive element of the plurality of second conductive elements; and
        an output connected through the first redistribution layer, through a via of the plurality of vias, and through the second redistribution layer, to a conductive element of the plurality of first conductive elements.

7. The package of claim 5, wherein:
    the semiconductor die comprises a modulator driver, on the front surface of the semiconductor die,
    the modulator driver has:
        a first input connected through the first redistribution layer, through a via of the plurality of vias, and through the second redistribution layer, to a conductive element of the plurality of first conductive elements; and
        a second input connected through the first redistribution layer to a conductive element of the plurality of second conductive elements.

8. A method for fabricating the package of claim 1, the method comprising:

forming a plurality of conductive posts, including the first conductive elements, on a surface of a semiconductor wafer having a front surface and a back surface, the conductive posts being formed on the back surface of the semiconductor wafer;

dicing the semiconductor wafer to form a plurality of semiconductor dies comprising the semiconductor die, each of the semiconductor dies having a front surface corresponding to the front surface of the semiconductor wafer, a back surface corresponding to the back surface of the semiconductor wafer, and a plurality of side surfaces;

applying a mold compound to the semiconductor dies, the applying the mold compound comprising covering the back surface of each of the semiconductor dies with the mold compound;

grinding the mold compound to reveal the conductive posts; and forming a plurality of conductive pillar bumps, including the second conductive elements, on the front surface of each of the semiconductor dies.

9. The method of claim 8, wherein the applying of the mold compound further comprises covering the side surfaces of each of the semiconductor dies with the mold compound.

10. The method of claim 8, wherein the conductive posts are copper posts and the conductive pillar bumps are copper pillar bumps.

11. The method of claim 8, wherein each of the semiconductor dies is a silicon die having a plurality of through-silicon vias each extending from the front surface of the semiconductor die to the back surface of the semiconductor die.

12. The method of claim 8, further comprising forming a first redistribution layer on the front surface of the semiconductor wafer before the forming of the plurality of conductive pillar bumps, wherein the forming of the plurality of conductive pillar bumps comprises forming the plurality of conductive pillar bumps directly on the first redistribution layer.

13. The method of claim 8 further comprising forming a second redistribution layer on the back surface of the semiconductor wafer before the forming of the conductive posts, wherein the forming of the conductive posts comprises forming the conductive posts directly on the second redistribution layer.

14. The system of claim 1, comprising:

an integrated circuit comprising an array of conductors on a bottom surface of the integrated circuit, the integrated circuit being attached to the top surface of the package such that the array of conductors of the integrated circuit are electrically coupled to the plurality of first conductive elements.

15. The system of claim 1, wherein the semiconductor die comprises a plurality of transistors on the front surface of the die, the PIC comprises a plurality of optoelectronic devices, and electrical terminals of the optoelectronic devices are:

directly connected, through conductive traces on the PIC, to the second conductive elements; and directly connected, through the conductive traces, the second conductive elements, and the first redistribution layer, to the transistors.

* * * * *